US008830681B2

(12) United States Patent
Liu

(10) Patent No.: US 8,830,681 B2
(45) Date of Patent: Sep. 9, 2014

(54) ELECTRONIC DEVICE WITH HEAT DISSIPATION APPARATUS

(75) Inventor: Lei Liu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 231 days.

(21) Appl. No.: 13/554,150

(22) Filed: Jul. 20, 2012

(65) Prior Publication Data

US 2013/0335922 A1    Dec. 19, 2013

(30) Foreign Application Priority Data

Jun. 19, 2012    (CN) .......................... 2012 1 0202725

(51) Int. Cl.
*H05K 7/20*    (2006.01)
*F28F 9/00*    (2006.01)

(52) U.S. Cl.
CPC .............. *H05K 7/20* (2013.01); *H05K 7/2039* (2013.01); *H05K 7/20645* (2013.01); *F28F 9/00* (2013.01)
USPC ...... 361/714; 361/679.54; 361/704; 361/709; 361/710; 165/80.2; 165/104.33; 165/185

(58) Field of Classification Search
CPC ... H05K 7/20; H05K 7/2039; H05K 7/20409; H05K 7/20418; H05K 7/20645; H05K 7/20436; F28F 9/00
USPC .......... 361/679.46, 679.54, 679.55, 688, 689, 361/690–697, 704–714, 719–724; 165/80.2, 80.3, 80.4, 104.33, 121–126, 165/185; 257/706–727; 174/16.3, 15.1, 174/15.2; 312/223.2; 29/602.1, 841, 854, 29/592.1, 832

See application file for complete search history.

(56) References Cited

U.S. PATENT DOCUMENTS

| 5,829,515 | A  | * | 11/1998 | Jeffries et al. ................. | 165/80.3 |
| 7,180,747 | B2 | * | 2/2007  | Lee ................................ | 361/720  |
| 7,532,474 | B2 | * | 5/2009  | Xue et al. ...................... | 361/704  |
| 7,961,471 | B2 | * | 6/2011  | Odanaka et al. .............. | 361/711  |
| 8,254,128 | B2 | * | 8/2012  | Yasui ............................. | 361/711  |
| 8,270,170 | B2 | * | 9/2012  | Hughes et al. ................ | 361/710  |
| 2007/0291450 | A1 | * | 12/2007 | Watanabe ...................... | 361/688  |
| 2011/0110041 | A1 | * | 5/2011  | Wong ............................. | 361/697  |

* cited by examiner

*Primary Examiner* — Michail V Datskovskiy
(74) *Attorney, Agent, or Firm* — Novak Druce Connolly Bove + Quigg LLP

(57) ABSTRACT

A heat dissipation apparatus for an electronic component installed in an enclosure of an electronic device includes a bracket and a heat sink. The bracket includes a supporting plate, an elastic positioning plate extending slantingly up from a side of the supporting plate away from the electronic component, and an installation plate extending from the positioning plate to be attached to the enclosure. The heat sink is fixed to the supporting plate to abut against the electronic component.

14 Claims, 3 Drawing Sheets

ELECTRONIC DEVICE WITH HEAT DISSIPATION APPARATUS

BACKGROUND

1. Technical Field

The disclosure relates to electronic devices and, particularly, to an electronic device with a heat dissipation apparatus.

2. Description of Related Art

During operation of an electronic component of an electronic device, such as a high speed signal interface of a server, a large amount of heat is often produced. The heat must be quickly removed from the high speed signal interface to prevent unstable operation or damage to the high speed signal interface. Typically, the heat is dissipated to the surrounding air of the high speed signal interface, and the heat is conducted out of the server by the system fans. However dissipation heat to the air of the enclosure is slow and inefficient.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
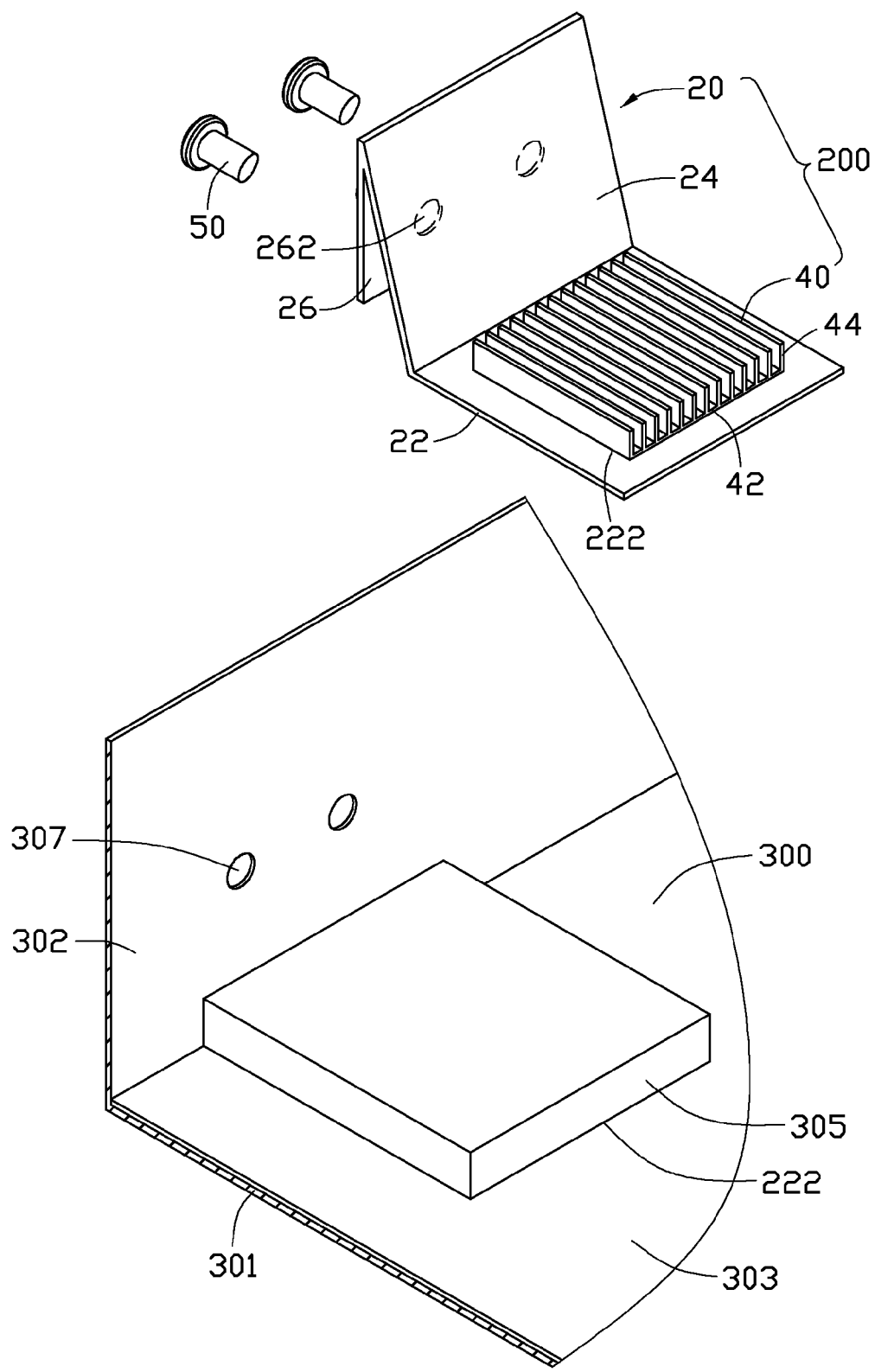
FIG. 1 is an isometric, exploded view of a first embodiment of an electronic device.

Referring to FIG. 1, a first embodiment of an electronic device includes an enclosure 300 and a heat dissipation apparatus 200 for dissipating the heat of an electronic component 305 installed in the enclosure 300. The heat dissipation apparatus 200 includes a bracket 20 and a heat sink 40. In the embodiment, the electronic device is a server, and the electronic component 305 is a high speed signal interface.

The enclosure 300 includes a bottom wall 301 and a sidewall 302 extending perpendicularly up from a side of the bottom wall 301. A motherboard 303 is installed on the bottom wall 301, and the electronic component 305 is mounted on the motherboard 303 adjacent to the sidewall 302. The sidewall 302 defines two through holes 307 above the electronic component 305.

The bracket 20 includes a rectangular supporting plate 22, an elastic positioning plate 24 extending slantingly up from a side of the supporting plate 22, and an installation plate 26 extending down from a top side of the positioning plate 24 opposite to the supporting plate 22. An angle between the supporting plate 22 and the positioning plate 24 is obtuse. A middle of the supporting plate 22 defines an opening 222. The installation plate 26 defines two screw holes 262. In one embodiment, the bracket 20 is made of a resilient metal material, such as a resilient steel sheet. An angle between the positioning plate 24 and the installation plate 26 is acute.

The heat sink 40 includes a base 42 extending through and mounted in the opening 222 of the supporting plate 22 by welding, and a plurality of fins 44 extending perpendicularly up from the base 42.

Figure 2:
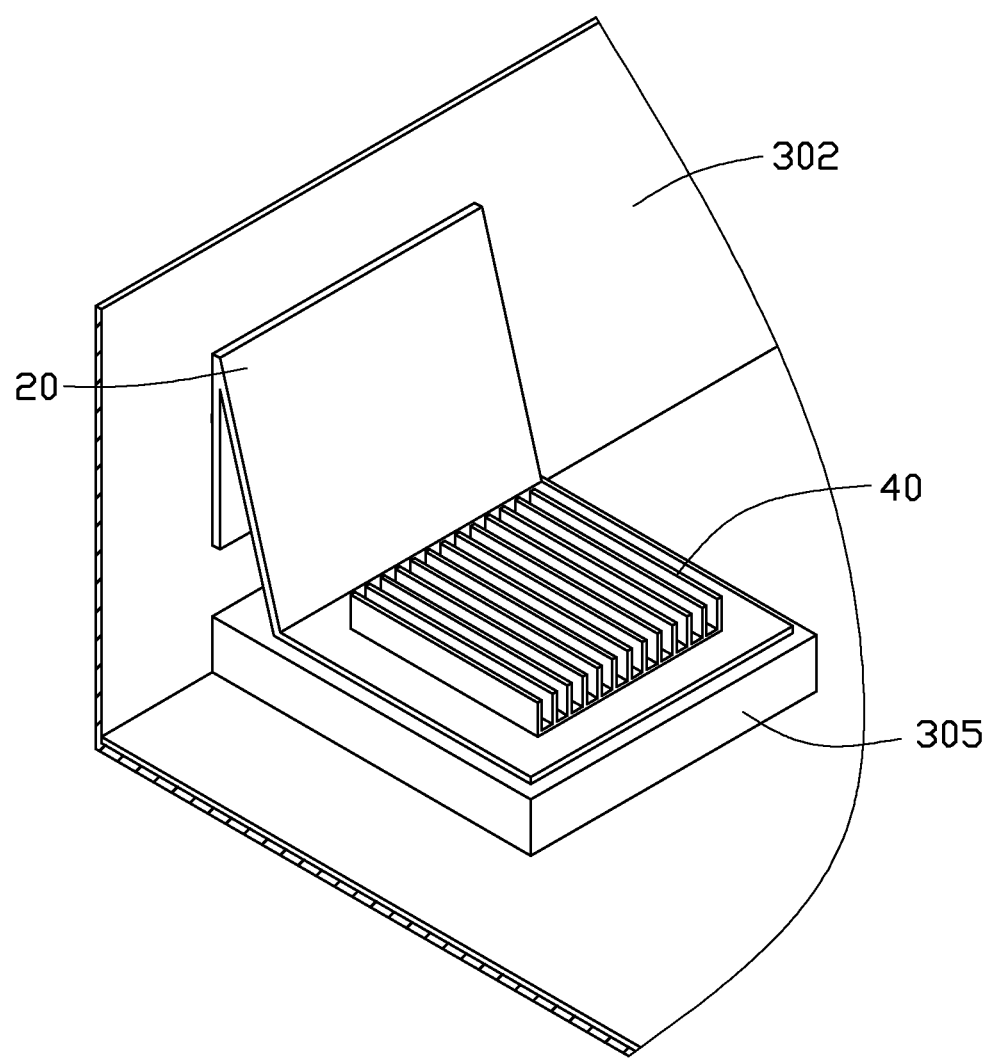
FIG. 2 is an assembled, isometric view of the electronic device of FIG. 1.

Referring to FIG. 2, in assembly, a bottom surface of the base 42 is attached on the electronic component 305, and the installation plate 26 is attached to an inner surface of the sidewall 302. Two screws 50 extend through the through holes 307 from an outer surface of the sidewall 302, to screw in the corresponding screw holes 262. The installation plate 26 is attached to the sidewall 302 to allow the bracket 20 to press the electronic component 305, allowing the bottom surface of the base 42 to tightly abut against the electronic component 305.

In use, some of the heat generated by the electronic component 305 is transferred to the fins 44 through the base 42 of the heat sink 40 and the rest of the heat is transferred to the enclosure 300 through the supporting plate 22, the positioning plate 24, and the installation plate 26 in that order. Therefore, a large dissipating surface is formed by the heat sink 40, and the enclosure 300, so that the heat can be removed efficiently and timely.

Figure 3:
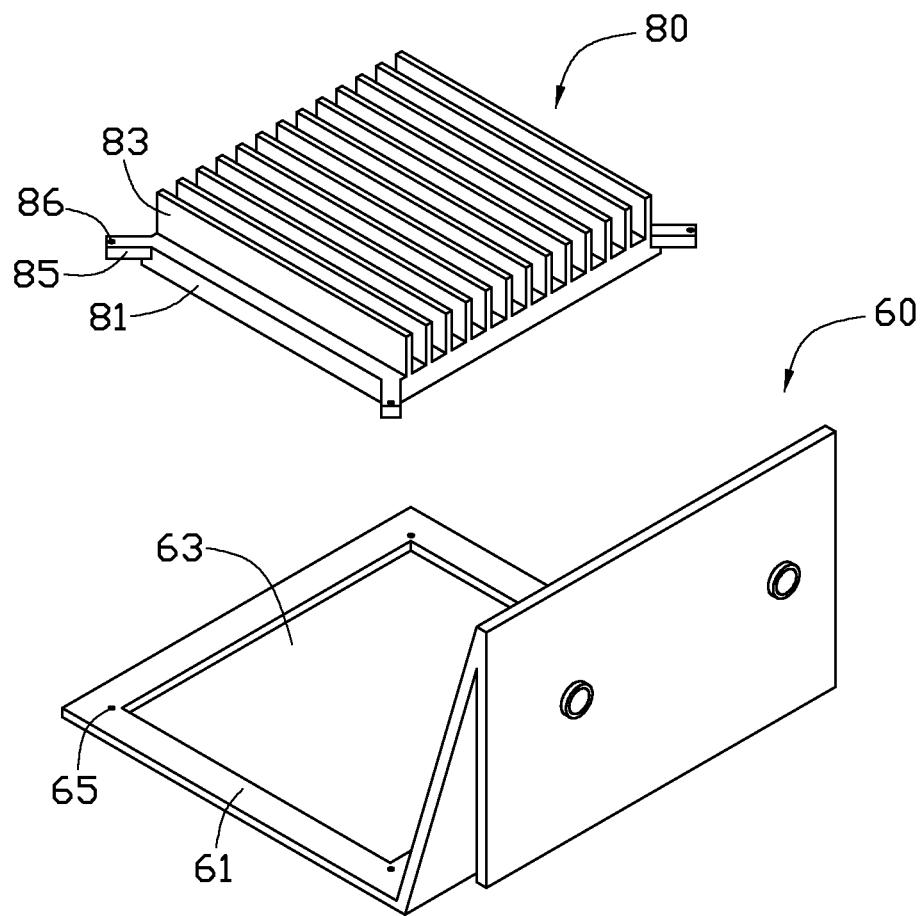
FIG. 3 is an isometric, exploded view of a second embodiment of an electronic device.

Referring to FIG. 3, a second embodiment of an electronic device is substantially similar to the first embodiment of the electronic device, except that a heat sink 80 is detachably installed to a bracket 60. The bracket 60 includes a supporting plate 61 defining a rectangular opening 63. The supporting plate 61 defines four screw holes 65 respectively adjacent to four corners of the opening 63. The heat sink 80 includes a rectangular base 81 and a plurality of fins 83 extending up from the base 81. Four tabs 85 respectively extend out from four corners of the base 81. Each tab 85 defines a through hole 86. In assembly, the base 81 of the heat sink 80 is received in the opening 63 of the bracket 60 from a top surface of the supporting plate 61. Four screws extend through the through holes 86, to screw in the corresponding through holes 65. Different heat sinks can be detachably installed to the bracket 60 according to different heat generated by the electronic component 305.

It is to be understood, however, that even though numerous characteristics and advantages of certain embodiments have been set forth in the foregoing description, together with details of the structures and functions of the embodiments, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A heat dissipation apparatus for cooling an electronic component received in an enclosure, the heat dissipation apparatus comprising:
   a bracket comprising a supporting plate, an elastic positioning plate extending slantingly up from a side of the supporting plate, and an installation plate extending from the positioning plate to be attached to the enclosure; and
   a heat sink fixed to the supporting plate to abut against the electronic component.

2. The heat dissipation apparatus of claim 1, wherein the installation plate extends down from a top side of the positioning plate, and an angle between the positioning plate and the installation plate is acute.

3. The heat dissipation apparatus of claim 1, wherein the installation plate defines two screw holes such that the installation plate can be directly fixed to the enclosure by two screws extending through the enclosure to engage in the screw holes.

4. The heat dissipation apparatus of claim 1, wherein the heat sink comprises a base installed to the supporting plate and a plurality of fins extending up from the base, a bottom surface of the base extends through the supporting plate to abut against the electronic component.

5. The heat dissipation apparatus of claim 1, wherein the heat sink is detachably installed to the supporting plate.

6. The heat dissipation apparatus of claim 5, wherein the supporting plate defines an opening in a middle portion and four screw holes respectively adjacent to four corners of the opening, the heat sink comprises a base received in the opening and a plurality of fins extending up from the base, four tabs respectively extend out from four corners of the base, each tab defines a through hole, and four screws extend through the through holes of the tabs to engage in the screw holes.

7. The heat dissipation apparatus of claim 1, wherein the bracket is made of resilient metal material.

8. An electronic device, comprising:
an enclosure comprising a bottom wall and a sidewall extending up from a side of the bottom wall;
a motherboard mounted on the bottom wall and comprising an electronic component located adjacent to the sidewall; and
a heat dissipation apparatus comprising a bracket and a heat sink;
wherein the bracket comprises a supporting plate, an elastic positioning plate extending slantingly up from a side of the supporting plate away from the electronic component, and an installation plate extending from the positioning plate and attached to the sidewall, the heat sink is fixed to the supporting plate and abuts against the electronic component.

9. The electronic device of claim 8, wherein the installation plate extends down from a top side of the positioning plate, and an angle between the positioning plate and the installation plate is acute.

10. The electronic device of claim 8, wherein the installation plate defines two screw holes, the sidewall defines two through holes above the electronic component, two screws extend through the through holes to engage in the screw holes.

11. The electronic device of claim 8, wherein the heat sink comprises a base installed to the supporting plate and a plurality of fins extending up from the base, a bottom surface of the base extends through the supporting plate to abut against the electronic component.

12. The electronic device of claim 8, wherein the heat sink is detachably installed to the supporting plate.

13. The electronic device of claim 12, wherein the supporting plate defines an opening in a middle portion and four screw holes respectively adjacent to four corners of the opening, the heat sink comprises a base received in the opening and a plurality of fins extending up from the base, four tabs respectively extend out from four corners of the base, each tab defines a through hole, and four screws extend through the through holes of the tabs to engage in the screw holes.

14. The electronic device of claim 8, wherein the bracket is made of resilient metal material.

* * * * *